United States Patent
Sonobe et al.

(10) Patent No.: US 10,170,695 B2
(45) Date of Patent: Jan. 1, 2019

(54) MAGNETIC TUNNEL JUNCTION DEVICE UTILIZING LATTICE STRAIN

(71) Applicants: Yoshiaki Sonobe, Yokohama (JP); Hiroyoshi Itoh, Osaka (JP)

(72) Inventors: Yoshiaki Sonobe, Yokohama (JP); Hiroyoshi Itoh, Osaka (JP)

(73) Assignee: SAMSUNG ELECTRONICS CO., LTD. (KR)

( * ) Notice: Subject to any disclaimer, the term of this patent is extended or adjusted under 35 U.S.C. 154(b) by 157 days.

(21) Appl. No.: 15/283,272

(22) Filed: Sep. 30, 2016

(65) Prior Publication Data
US 2017/0117458 A1   Apr. 27, 2017

(30) Foreign Application Priority Data

Oct. 26, 2015 (JP) ................... 2015-209528

(51) Int. Cl.
| | |
|---|---|
| *H01L 43/02* | (2006.01) |
| *H01L 43/10* | (2006.01) |
| *G11C 11/16* | (2006.01) |
| *H01L 27/22* | (2006.01) |
| *H01L 43/08* | (2006.01) |
| *H01L 43/12* | (2006.01) |

(52) U.S. Cl.
CPC ............ *H01L 43/10* (2013.01); *G11C 11/161* (2013.01); *H01L 27/228* (2013.01); *H01L 43/02* (2013.01); *H01L 43/08* (2013.01); *H01L 43/12* (2013.01)

(58) Field of Classification Search
CPC ......... H01L 43/10; H01L 43/02; H01L 43/12; H01L 27/228; H01L 43/08; G11C 11/161
See application file for complete search history.

(56) References Cited

U.S. PATENT DOCUMENTS

| | | |
|---|---|---|
| 7,307,302 B2 | 12/2007 | Saito |
| 8,107,281 B2 | 1/2012 | Kai et al. |
| 8,686,521 B2 | 4/2014 | Daibou et al. |
| 2005/0041456 A1 | 2/2005 | Saito |

(Continued)

FOREIGN PATENT DOCUMENTS

| | | |
|---|---|---|
| JP | 200532878 A | 2/2005 |
| JP | 2005150303 A | 6/2005 |

(Continued)

OTHER PUBLICATIONS

Kamada, Tomonari et al., "Perpendicular Magnetic Anisotropy of Co2FexMn1—xSi Heusler Alloy Ultra-Thin Films," IEEE Transactions on Magnetics, vol. 50, No. 11, Nov. 2014, 4 pages.

(Continued)

*Primary Examiner* — Yu-Hsi D Sun
(74) *Attorney, Agent, or Firm* — Renaissance IP Law Group LLP

(57) ABSTRACT

A magnetic tunnel junction device includes a Heusler alloy layer that has not only a perpendicular magnetic anisotropy characteristic, but also a half-metallicity characteristic. For example, the magnetic tunnel junction device includes at least one Heusler alloy layer and a barrier layer. The barrier layer is in contact with the Heusler alloy layer and has an insulating property. A compressive strain is exerted on the Heusler alloy layer in a direction parallel to an interface between the Heusler alloy layer and the barrier layer.

19 Claims, 7 Drawing Sheets

(56) References Cited

U.S. PATENT DOCUMENTS

| | | |
|---|---|---|
| 2010/0244163 A1 | 9/2010 | Daibou et al. |
| 2011/0073970 A1 | 3/2011 | Kai et al. |
| 2014/0145279 A1* | 5/2014 | Kato ................ H01L 43/08 257/425 |
| 2014/0284534 A1* | 9/2014 | Nagase .............. H01L 43/12 257/1 |

FOREIGN PATENT DOCUMENTS

| | | |
|---|---|---|
| JP | 2010238769 A | 10/2010 |
| JP | 201171352 A | 4/2011 |

OTHER PUBLICATIONS

Takamura, Yota et al., "Full-Heusler Co2FeSi alloy thin films with perpendicular magnetic anisotropy induced by MgO-interfaces," Journal of Applied Physics 115, 17C732, 2014, 4 pages.

Ikeda, S. et al., "A perpendicular-anisotropy CoFeB—MgO magnetic tunnel junction," Nature Materials, vol. 9, Sep. 2010, Published Online: Jul. 11, 2010, pp. 721-724.

Koo, J. W. et al., "Large perpendicular magnetic anisotropy at Fe/MgO interface," Applied Physics Letters 103, 192401 (2013), AIP Publishing LLC, published online Nov. 4, 2013, 4 pages.

Wen, Zhenchao et al., "Perpendicular magnetization of Co2FeAl full-Heusler alloy films induced by MgO interface," Applied Physics Letters 98, 242507 (2011), American Institute of Physics, Jun. 16, 2011, 3 pages.

\* cited by examiner

MAGNETIC TUNNEL JUNCTION DEVICE UTILIZING LATTICE STRAIN

CROSS-REFERENCE TO RELATED APPLICATION

This U.S. non-provisional patent application claims priority under 35 U.S.C. § 119 to Japanese Patent Application JP 2015-209528, filed on Oct. 26, 2015, in the Japan Patent Office, the entire contents of which are hereby incorporated by reference.

BACKGROUND

The present disclosure relates to a magnetic tunnel junction device, and more particularly, to a magnetic tunnel junction device that provides a highly-integrated perpendicular magnetization spin-transfer-torque magnetoresistive random access memory (STT-MRAM) device using a spin-injection magnetization-switching effect.

In magnetoresistive devices, a magnetoresistive effect is used to determine data stored therein. In particular, a magnetoresistive device having a perpendicular magnetization property has excellent thermal stability, regardless of its size, and thus, it is emerging as a next-generation memory device.

Such a next-generation magnetoresistive memory device may include a magnetic tunnel junction (MTJ) device having a MTJ layer. The MTJ layer of the MTJ device may include a free layer having a switchable magnetization direction, a reference layer having a fixed magnetization direction, and an MgO barrier layer interposed therebetween.

To meet some technical requirements for the next-generation magnetoresistive memory device, a ferromagnetic material having a high perpendicular magnetic anisotropy and a high spin polarization is needed.

SUMMARY

According to some embodiments, a Heusler alloy may be used to realize a MTJ device with both perpendicular magnetic anisotropy and half-metallicity characteristics.

According to some embodiments, a magnetic tunnel junction device may include at least one Heusler alloy layer and a barrier layer, which is in contact with the Heusler alloy layer and is formed to have an insulating property. A compressive strain from the barrier layer may be exerted on the Heusler alloy layer in a direction parallel to an interface between the Heusler alloy layer and the barrier layer.

In some embodiments, the interface between the Heusler alloy layer and the barrier layer may be parallel to an xy-plane. When measured along an x-axis and/or a y-axis, a lattice constant of the barrier layer may be within a range of about 96% to about 98%, compared with that of the Heusler alloy layer.

In some embodiments, the Heusler alloy layer may be formed from a Co-based full-Heusler alloy having a $L2_1$ crystal structure.

In some embodiments, the barrier layer may contain at least one of $CaF_2$, $CeO_2$, $PrO_2$, $SrTiO_3$, $Sm_2O_3$, $Gd_2O_3$, or Si.

In some embodiments, the magnetic tunnel junction device may further include a buffer layer in contact with the Heusler alloy layer. Here, the Heusler alloy layer may have a first surface and a second surface that are opposite to each other, the barrier layer may be in contact with the first surface, and the buffer layer may be in contact with the second surface.

In some embodiments, the buffer layer may contain at least one of $CaF_2$, $CeO_2$, $PrO_2$, $SrTiO_3$, $Sm_2O_3$, $Gd_2O_3$, or Si.

In some embodiments, the Heusler alloy layer may include a pair of Heusler alloy layers, one of which is in contact with a surface of the barrier layer, and the other of which is in contact with an opposite surface of the barrier layer.

According to some embodiments, a magnetoresistive memory device may include a magnetic tunnel junction device, in which at least one Heusler alloy layer and a barrier layer are provided, and an electrode is configured to apply a voltage to the magnetic tunnel junction device. The barrier layer may be in contact with the Heusler alloy layer and may have an insulating property. A compressive strain may be exerted on the Heusler alloy layer in a direction parallel to an interface between the Heusler alloy layer and the barrier layer.

According to some embodiments, a magnetic tunnel junction device may include a first magnetic layer that may include a first Heusler alloy having a first lattice parameter; and a barrier layer that may include a first surface that in contact with the first magnetic layer, the barrier layer comprising a dielectric material and having a second lattice parameter, the second lattice parameter being smaller than the first lattice parameter. In one embodiment, the barrier layer further comprises a second surface that is opposite the first surface in which case the magnetic tunnel junction device may further include a second magnetic layer that is in contact with the second surface of the barrier layer in which the second magnetic layer may include a second Heusler alloy having a third lattice parameter and which the third lattice parameter may be greater than the second lattice parameter.

According to some embodiments, a magnetoresistive device may include a first magnetic layer that may include a first Heusler alloy having a first lattice parameter; a second magnetic layer that may include a second Heusler alloy having a second lattice parameter; and a barrier layer that may be disposed between the first magnetic layer and the second magnetic layer and may include a first surface and a second surface that is opposite from the first surface in which the first surface may be in contact with the first magnetic layer and the second surface may be in contact with the second magnetic layer and in which the barrier layer may include a dielectric material and may have a third lattice parameter in which the third lattice parameter may be smaller than the first lattice parameter and the second lattice parameter.

According to some embodiment, a magnetic memory device may include a plurality of magnetic memory cells arranged in an array in which at least one magnetic memory cell may include a first magnetic layer may include a first Heusler alloy having a first lattice parameter; a second magnetic layer may include a second Heusler alloy having a second lattice parameter; and a barrier layer may be disposed between the first magnetic layer and the second magnetic layer and may include a first surface and a second surface that is opposite from the first surface in which the first surface may be in contact with the first magnetic layer and the second surface may be in contact with the second magnetic layer in which the barrier layer may include a dielectric material and may have a third lattice parameter in which the third lattice parameter may be smaller than the first lattice parameter and the second lattice parameter.

According to some embodiments, a method to form a magnetic tunnel junction device may include forming a first magnetic layer comprising a first Heusler alloy having a first lattice parameter; and forming a barrier layer comprising a first surface that in contact with the first magnetic layer in which the barrier layer includes may include a dielectric material and may have a second lattice parameter in which the second lattice parameter may be smaller than the first lattice parameter.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
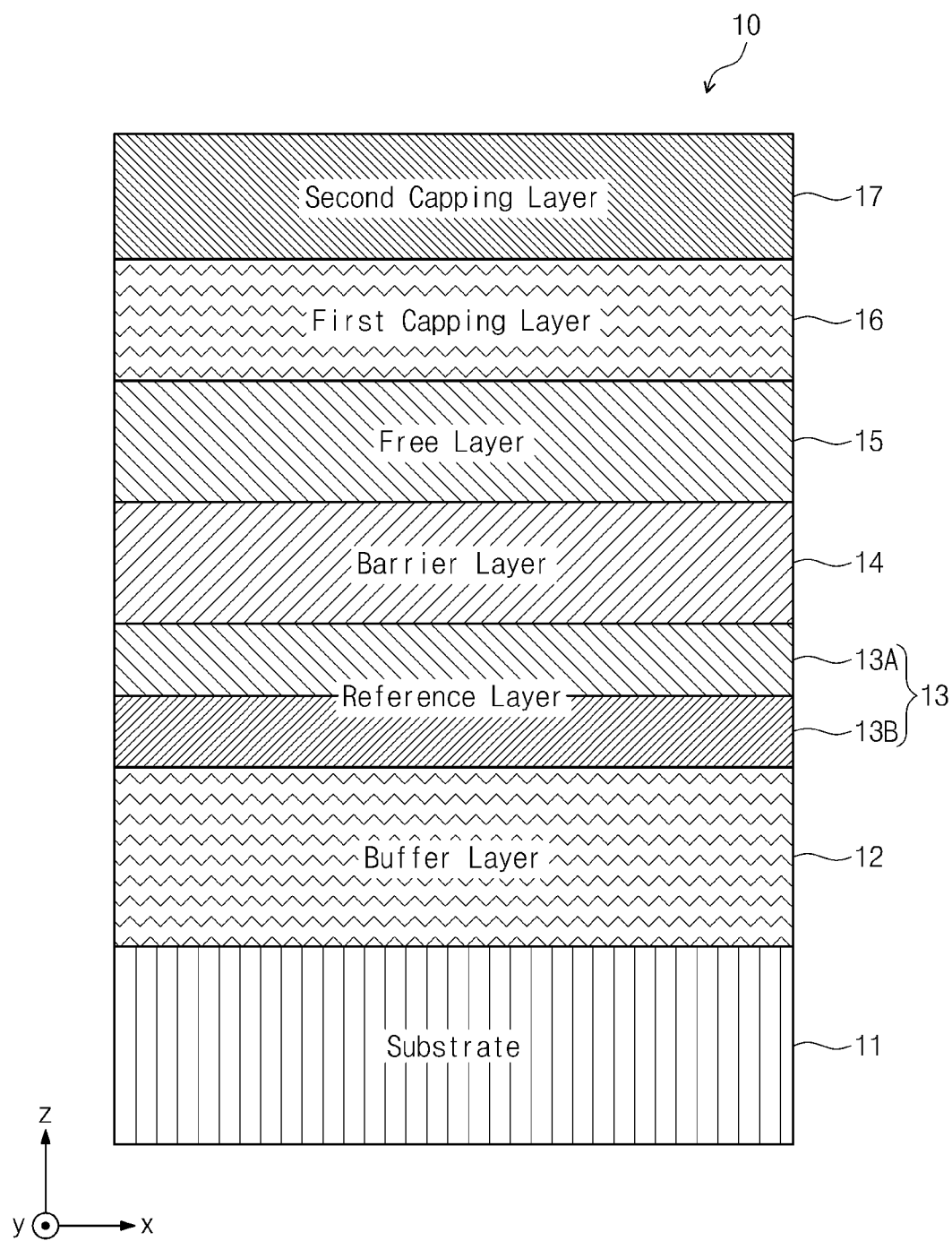
FIG. 1 depicts a sectional view of a magnetic tunnel junction device according to a first embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Only CoFeB metal ferromagnetic materials or Mn—Ge based materials are known to exhibit a perpendicular magnetic anisotropy and, theoretically, a high spin polarization characteristic, and thus, a range of materials available for the magnetoresistive device is very narrow.

With regard to CoFeB metal ferromagnetic materials that are currently in a research and development phase, Japanese Patent Application No. 2010-238769 A discloses a MTJ device in which a stabilization layer having a lattice constant that is less than the lattice constant of a spin polarization layer is provided in contact with the spin polarization layer and that shrinks, or compresses, a crystal lattice of the spin polarization layer in both x- and y-directions.

The perpendicular magnetic anisotropy property, however, is dependent on material characteristics (e.g., composition, crystal structure, magnetic element), and, in all magnetic materials, lattice distortion does not cause an increase in perpendicular magnetic anisotropy. In general, the effect of the lattice distortion on the perpendicular magnetic anisotropy is strongly dependent on material characteristics of a magnetic material.

In the meantime, Co-based Heusler alloys have a high spin polarization and a high Curie temperature, and thus, using a Co-based Heusler alloy may allow a ferromagnetic tunnel junction device to have a giant magnetoresistive ratio.

Japanese Patent Application Nos. 2011-71352 A, 2005-150303 A and 2005-32878 A, and the Journal of Applied Physics 115, 17C732 2014, IEEE Transactions on Magnetics, vol. 50, No. 11, 2600304 disclose MTJ devices that may be used for a perpendicular magnetization STT-MRAM.

Since a Co-based Heusler alloy in itself does not have perpendicular magnetic anisotropy, a way of adding a perpendicular magnetization preserving layer in a magnetic tunnel junction device is being considered. However, in the case that the Co-based Heusler alloy is used in the MTJ device, a layer thickness of the MTJ device is increased to cause an increase in a magnetization switching current. As a result, it is difficult to realize a low-power magnetic memory device.

Furthermore, research is being conducted on an interface magnetic anisotropy, but due to low perpendicular magnetic anisotropy of the Co-based Heusler alloy, in order to meet requirements for half-metallicity, it is necessary to increase a thickness of a Heusler alloy layer. In the case that the Heusler alloy layer is formed to have a thickness of 1 nm or larger, the MTJ device may suffer from a change in a magnetic anisotropy direction (e.g., from "perpendicular" to "in-plane").

That is, as described above, the conventional use of Heusler alloy may not allow a MTJ device to have both the perpendicular magnetic anisotropy and the half-metallicity characteristics.

According to some embodiments, a Heusler alloy layer may be provided to have not only a perpendicular magnetic anisotropy characteristic, but to also have a half-metallicity characteristic. The relationship of the perpendicular magnetic anisotropy and the half-metallicity characteristics based on lattice distortion are examined based on first-principles calculations, and the result shows that if there is a compressive lattice distortion, a high perpendicular magnetic anisotropy characteristic and a half-metallicity characteristic may be provided in the Heusler alloy layer. Furthermore, this result shows that it is important for an insulating barrier layer to have a lattice constant that is less than the lattice constant of the Heusler material. In some embodiments, $CaF_2$ (calcium fluoride) or $CeO_2$ (Cerium Oxide or Ceria) may be used for the barrier layer. Accordingly, embodiments disclosed herein may be used to provide a perpendicular magnetic tunnel junction (MTJ) device suitable for a next-generation STT-MRAM device.

First Embodiment

Hereinafter, some example embodiments are described with reference to the accompanying drawings. FIG. 1 depicts a sectional view of a MTJ device according to a first embodiment. Referring to FIG. 1, an MTJ device 10 may include a substrate 11, a buffer layer 12, a reference, or pinned, layer 13, a barrier layer 14, a free layer 15, a first capping layer 16, and a second capping layer 17.

The substrate 11 may be a silicon (Si) substrate having a thermally-grown oxide layer or a single-crystalline silicon (Si) substrate.

The buffer layer 12 may be formed on the substrate 11 and may be used as a stabilization layer. The buffer layer 12 may be a layer containing at least one of Cr, Ta, Au, W, Pt, or Ti.

The reference layer 13 may include a Heusler alloy layer 13A and a Co/Pt multilayer 13B. In some embodiments, the Heusler alloy layer 13A may be formed from a Co-based full-Heusler alloy. The Co-based full-Heusler alloy may include, for example, $Co_2FeSi$, $Co_2MnSi$, $Co_2(Fe-Mn)Si$, $Co_2FeAl$, $Co_2CrAl$ or a combination thereof. The Co/Pt multilayer 13B may be configured to allow the reference layer 13 to have large perpendicular magnetic anisotropy characteristic. As shown in FIG. 1, the Heusler alloy layer 13A may be in contact with the barrier layer 14, and the Co/Pt multilayer 13B may be in contact with the buffer layer 12. That is, the reference layer 13 is configured so that the Heusler alloy layer 13A is disposed next to and in contact with the barrier layer 14, and the Co/Pt multilayer 13B is disposed next to and in contact with the buffer layer 12.

The barrier layer 14 may be formed from an insulating material. The barrier layer 14 may be interposed between the reference layer 13 and the free layer 15, which both have a ferromagnetic property. In the case in which a voltage is applied between the reference layer 13 and the free layer 15, a current may pass through the MTJ device 10 in a direction that is substantially perpendicular to an interface between the reference layer 13 and the free layer 15 by a tunneling effect. That is, a current may pass through the MTJ device 10 in a direction (i.e., in a direction substantially parallel to the z-axis) that is substantially perpendicular to a plane formed by the x- and y-axes in FIG. 1.

The free layer 15 may be formed from a Heusler alloy layer. In some embodiments, the free layer 15 may be formed from a Co-based full-Heusler alloy. The Co-based full-Heusler alloy may include, for example, $Co_2FeSi$, $Co_2MnSi$, $Co_2(Fe-Mn)Si$, $Co_2FeAl$, or $Co_2CrAl$.

The capping layer 16 (hereinafter, a first capping layer) may be formed on the free layer 15 and may be used as a stabilization layer. The first capping layer 16 may be a layer containing, for example, Ru and Ta.

The second capping layer 17 may be formed on the first capping layer 16 and may be used as a stabilization layer. The second capping layer 17 may be a layer containing, for example, at least one of Ru or Ta.

In the MTJ device 10, the barrier layer 14 may be formed from or include a material that has a lattice constant that is smaller than the lattice constants of the reference layer 13 and the free layer 15, and thus, the barrier layer 14 may exert a compressive strain on the reference layer 13 and the free layer 15 and may allow the reference layer 13 and the free layer 15 to have an increased perpendicular magnetic anisotropy. Furthermore, the MTJ device 10 may include the barrier layer 14 that is interposed between the reference layer 13 and the free layer 15 having an increased perpendicular magnetic anisotropy, and in the case in which there are voltage differences between the barrier layer 14, the reference layer 13 and the free layer 15, a current may pass through the MTJ device 10 in a direction that is perpendicular to interfaces between the barrier layer 14, the reference layer 13 and the free layer 15 by a tunneling effect. That is, a current may pass through the MTJ device 10 in a direction (i.e., in a direction substantially parallel to the z-axis) that is substantially perpendicular to a plane formed by the x- and y-axes in FIG. 1 by a tunneling effect.

Electric resistance of the MTJ device 10 may be low if the reference layer 13 and the free layer 15 have spin polarizations that are parallel to each other, and high if the reference layer 13 and the free layer 15 have spin polarization that are antiparallel to each other.

Figure 2:
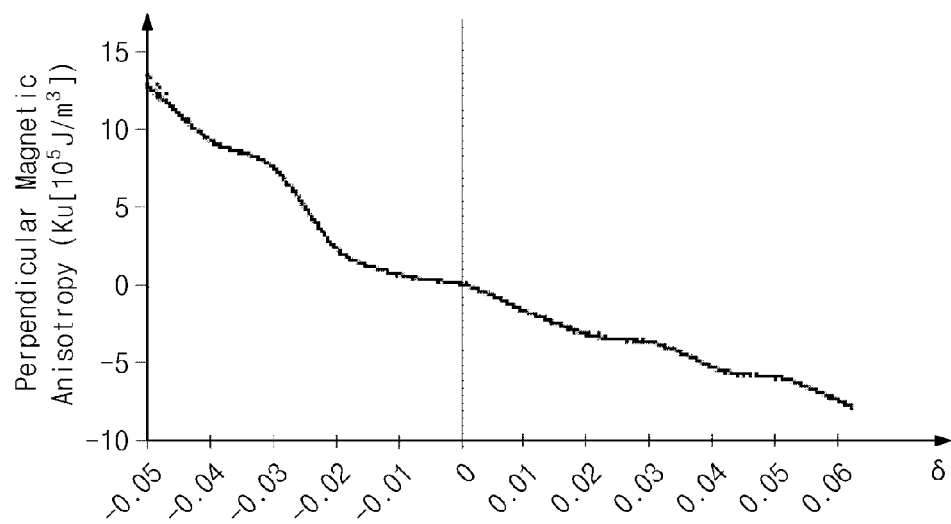
FIG. 2 depicts a graph showing a relationship between distortion and perpendicular magnetic anisotropy in Heusler alloy.

Next, a relationship between distortion and perpendicular magnetic anisotropy in the reference layer 13 and the free layer 15 is described. FIG. 2 depicts a graph showing a relationship between distortion and perpendicular magnetic anisotropy in a Heusler alloy. In FIG. 2, the horizontal axis represents an amount of distortion in a Heusler alloy, and the vertical axis represents perpendicular magnetic anisotropy of a Heusler alloy.

In FIG. 2, the perpendicular magnetic anisotropy may be defined as a magnetic anisotropy energy, Ku ($10^5$ J/m$^3$), given by Equation (1).

$$Ku = E|ijk| - E|001|, \qquad (1)$$

in which E|ijk| is an internal energy in a magnetization direction of (ijk), and E|001| is an internal energy in a magnetization direction of (001).

For example, the magnetic anisotropy energy Ku of a layer may be obtained from a difference in internal energy between the in-plane magnetization directions of (100) and (110) and the out-of-plane (e.g., perpendicular) magnetization direction of (001) (e.g., E[100]−E[001] and E[110]−E [001]). Here, in the case in which Ku is greater than 0, the layer may be a perpendicular magnetization layer.

In the case in which the lattice of a Heusler alloy is distorted from a cubic lattice (space group: Fm-3m) to a tetragonal lattice (space group: I4/mmm), the distortion δ of the Heusler alloy is given by the following definition:

$$\delta = (a - a_0)/a_0, \qquad (2)$$

in which $a_0$ is a lattice constant of three axes in a cubic lattice (i.e., $a_x = a_y = a_z = a_0$), and a is a lattice constant of two axes in a tetragonal lattice ($a_x = a_y = a$ and $a_z = c$). A positive value of distortion δ may correspond to a tensile distortion, whereas a negative value of distortion δ may correspond to a compressive distortion.

The relationship between the compressive distortion and the perpendicular magnetic anisotropy depicted in FIG. 2 was obtained by applying the first-principles calculations to a $Co_2MnSi$ Heusler alloy.

The first-principles calculations were performed using a computer program (e.g., Vienna Ab initio Simulation Package (VASP)) for electronic structure calculations based on a plane wave basis and a ground-pseudopotential method. A generalized gradient approximation (GGA) method was used to calculate an exchange correlation energy, and a projector augmented wave (PAW) method was used to handle an inner shell. Here, the cut-off energy of a plane wave was about 500 eV, and a wavenumber point sampling was performed using a Monkhorst-Pack method of dividing a Brillouin zone into 25×25×25 regions. The lattice constant "a" was assigned to a unit cell of Heusler alloy for structure optimization, and the lattice constant "c" was given to minimize the energy. Here, a condition for determining energy convergence was $10^{-7}$ eV/unit cell.

As depicted in FIG. 2, the perpendicular magnetic anisotropy of the $Co_2MnSi$ Heusler alloy increases rapidly if the distortion δ of the $Co_2MnSi$ Heusler alloy is less than −0.02. That is, the perpendicular magnetic anisotropy of the $Co_2MiSi$ Heusler alloy increases from about 0 J/m³ to about $12.5 \times 10^5$ J/m³ as the compressive distortion δ increases from about −0.02 to about −0.05.

Figure 3:
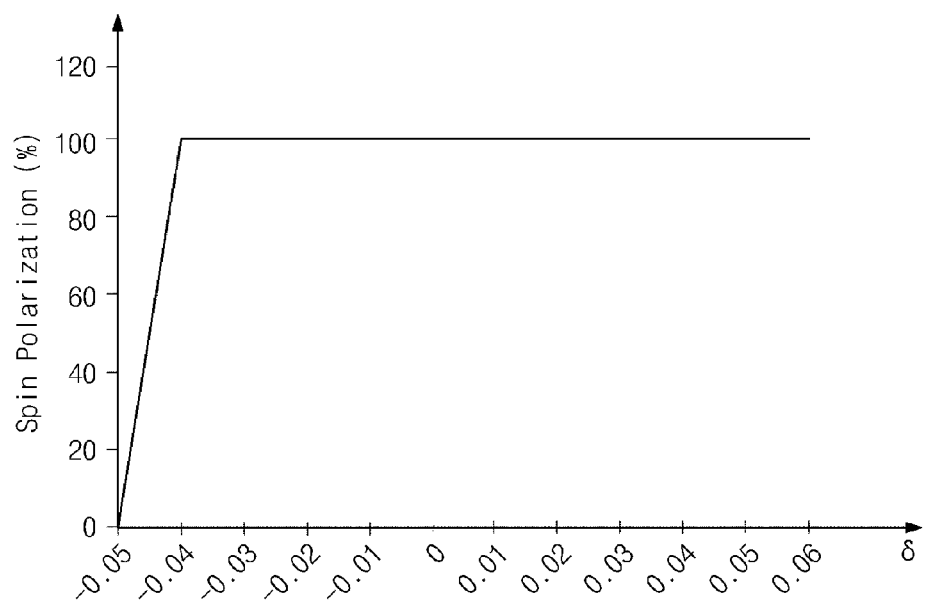
FIG. 3 depicts a graph showing a relationship between distortion and half-metallicity in Heusler alloy.

Next, a relationship between distortion and half-metallicity in the reference layer 13 and the free layer 15 is described. FIG. 3 depicts a graph showing a relationship between distortion δ and half-metallicity in a Heusler alloy. In FIG. 3, the horizontal axis represents the distortion δ of the Heusler alloy, and the vertical axis represents a spin polarization in percentage (%). The definition of the distortion δ of the Heusler alloy is the same as that described in Equation (2) with reference to FIG. 2.

The spin polarization may be obtained from a spin-up state density ($D_{up}$)) and a spin-up state density ($D_{down}$) of Fermi energy, by Equation (3).

$$P = (D\text{up} - D\text{down})/(D\text{up} + D\text{down}) \times 100 (\%) \quad (3)$$

If a value of P obtained by Equation (3) is 100%, the layer has a half-metallicity characteristic.

The spin polarization was calculated on the basis of the first-principles calculations, like the case of the perpendicular magnetic anisotropy of FIG. 2. The conditions for the first-principles calculations for FIG. 3 were the same as the conditions for FIG. 2.

As shown in FIG. 3, if the Heusler alloy has a distortion δ of about −0.04 or greater, the Heusler alloy has a spin polarization of 100%. That is, in the case in which the Heusler alloy has a distortion δ of about −0.04 or greater, the Heusler alloy may have a half-metallicity characteristic. More specifically, if the Heusler alloy as a distortion between about a compressive −0.04 and greater including a tensile distortion, the Heusler alloy may have a half-metallicity characteristic.

Thus, in the case in which the Heusler alloy has a distortion δ ranging from about −0.04 to about −0.02, the Heusler alloy may have both a perpendicular magnetic anisotropy characteristic and a half-metallicity characteristic.

Furthermore, in the case in which a lattice constant of an insulating material for the barrier layer 14 is less than the lattice constant of a Heusler alloy for the reference layer 13 and the free layer 15, the MTJ device is superior in aspects of high power and high thermal stability.

Next, a relationship between lattice constants of a Heusler alloy and an insulator allowing for compressive distortion of the Heusler alloy is described. Table 1 sets forth a relationship between a lattice constant of a material for the insulator and a strain caused by the insulator. In detail, Table 1 sets forth a relationship between an insulating material for the barrier layer, its lattice constant (a [nm]), a misfit in lattice constant with respect to Heusler alloy (Lattice Misfit [%]), and a type of strain. In Tables 1 and 2, the Lattice Misfitrol is given by an Equation (4).

$$\text{Lattice Misfit} = (a_{\text{insulating material}} - a_{\text{HeuslerAlloy}})/a_{\text{Heusler alloy}} \quad (4)$$

in which $a_{\text{insulating material}}$ is a lattice constant of the insulating material, and $a_{\text{Heusler alloy}}$ is a lattice constant of the Heusler alloy. As set forth in Table 1, four different materials (i.e., $Co_2MnSi$, $Co_2FeSi$, $Co_2FeAl$, and $Co_2CrAl$) were used as the Heusler alloy.

TABLE 1

| Insulator | Lattice constant (α [nm]) | Lattice Misfit [%] with respect to | | | |
|---|---|---|---|---|---|
| | | $Co_2MnSi$ | $Co_2FeSi$ | $Co_2FeAl$ | $Co_2FeAl$ Strain |
| MgO | 0.595 (0.421) | 5.3 | 5.1 | 3.8 | 3.7 Tensile |
| $MgAl_2O_4$ | 0.571 (0.808) | 1.1 | 0.9 | −0.3 | −0.5 Tensile/Compressive |
| $CaF_2$ | 0.546 | −3.4 | −3.5 | −4.7 | −4.9 Compressive |
| $CeO_2$ | 0.541 | −4.2 | −4.4 | −5.6 | −5.7 Compressive |
| $PrO_2$ | 0.539 | −4.6 | −4.8 | −5.9 | −6.1 Compressive |
| $SrTiO_3$ | 0.553 | −2.1 | −2.3 | −3.5 | −3.7 Compressive |
| $Sm_2O_3$ | 0.547 | −3.2 | −3.4 | −4.5 | −4.7 Compressive |
| $Gd_2O_3$ | 0.541 | −4.2 | −4.4 | −5.6 | −5.7 Compressive |
| Si | 0.543 | −3.9 | −4.1 | −5.2 | −5.4 Compressive |

As shown in Table 1, in the cases in which MgO and $MgAl_2O_4$ are used as the insulator, lattice constants of MgO and $MgAl_2O_4$ respectively are 0.421 and 0.808. Considering their lattice structures, the lattice constants of MgO and $MgAl_2O_4$ respectively are 0.595 and 0.571. A lattice constant of $Co_2MnSi$ Heusler alloy is 0.565. Thus, the lattice constant of MgO was larger by 5.3% than the lattice constant of the $Co_2MnSi$ Heusler alloy, and the lattice constant of $MgAl_2O_4$ is larger by 1.1% than the lattice constant of the $Co_2MnSi$ Heusler alloy. As a result, a tensile strain is exerted on the Heusler alloy. In the cases in which MgO or $MgAl_2O_4$ is used as the insulator and $Co_2FeSi$ is used as the Heusler alloy, the strain is also tensile. In the cases in which MgO is used as the insulator and $Co_2FeAl$ or $Co_2CrAl$ is used as the Heusler alloy, the strain is also tensile.

In contrast, in the cases in which $CaF_2$ or $CeO_2$ is used as the insulator, their lattice constants respectively were 0.546 and 0.541. Thus, the lattice constant of $CaF_2$ is smaller than the lattice constant of the $Co_2MnSi$ Heusler alloy by 3.4%, and the lattice constant of $CeO_2$ smaller than the lattice constant of the $Co_2MnSi$ Heusler alloy by 4.2%. As a result, a compressive strain is exerted on the Heusler alloy. Similarly, if $CaF_2$ or $CeO_2$ is used as the insulator, the strain is compressive, regardless whether $Co_2MnSi$, $Co_2FeSi$, $Co_2FeAl$, or $Co_2CrAl$ is used as the Heusler alloy. Furthermore, in the cases in which $PrO_2$, $SrTiO_3$, $Sm_2O_3$, $Gd_2O_3$, or Si is used as the insulator, the strain is compressive regardless whether $Co_2MnSi$, $Co_2FeSi$, $Co_2FeAl$, or $Co_2CrAl$ is used as the Heusler alloy.

As described above, the MTJ device of the first embodiment may include the barrier layer that is formed from an insulating material having a lattice constant that is smaller than the lattice constants of the reference and free layers, and this may make it possible to exert a compressive strain on the reference and free layers and, consequently, to improve perpendicular magnetic anisotropy characteristics of the reference and free layers.

In the MTJ device of the first embodiment, the barrier layer and the reference and free layers may be configured in such a way that a ratio between their lattice constants is within a particular range, thereby allowing the reference and free layers to both have a half-metallicity characteristic.

Furthermore, from the above definition of the distortion δ (Equation (2)), the distortion δ of the Heusler alloy may be expressed in terms of a ratio in lattice constant of an insulator for the barrier layer to a Heusler alloy for the reference and free layers.

For example, a case in which the distortion δ of the Heusler alloy is about −0.04 is substantially the same as a case in which a lattice constant of an insulator for the barrier layer is about 96% of the lattice constant of a Heusler alloy for the reference and free layers. Similarly, a case in which the distortion δ of the Heusler alloy is about −0.02 is substantially the same as a case in which a lattice constant of the insulator for the barrier layer is about 98% of the lattice constant of the Heusler alloy for the reference and free layers.

Second Embodiment

In the first embodiment, an underlying layer (e.g., the buffer or capping layer) may be formed from a known element (e.g., Cr, Ta, Au, W, Pt or Ti), whereas in the second embodiment the underlying layer (e.g., a buffer or capping layer) may be formed from a material having a lattice constant that is smaller or less than the lattice constants of the materials forming the reference and free layers.

Figure 4:
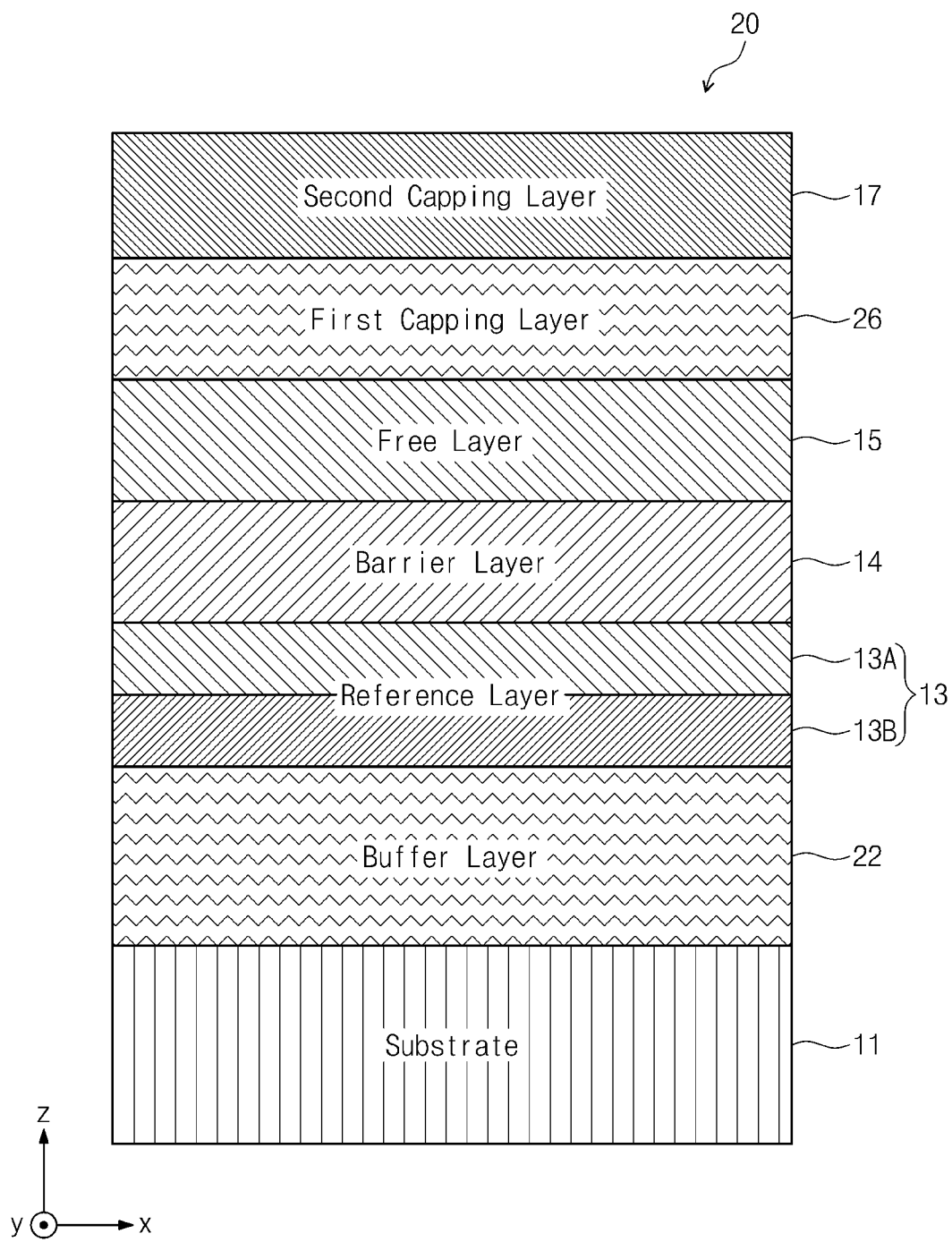
FIG. 4 depicts a sectional view of a magnetic tunnel junction device according to a second embodiment.

FIG. 4 depicts a sectional view of a MTJ device according to a second embodiment. In the following description of FIG. 4, an element previously described with reference to FIG. 1 may be identified by a similar or identical reference number without repeating a description thereof for the sake of brevity. Referring to FIG. 4, a MTJ device 20 may include the substrate 11, a buffer layer 22, the reference layer 13, the barrier layer 14, the free layer 15, a first capping layer 26, and the second capping layer 17.

The buffer layer 22 may have a lattice constant that is less than the lattice constants of the materials forming the reference layer 13 and the free layer 15. Similarly, the first capping layer 26 may have a lattice constant that is less than the lattice constants of the materials forming the reference layer 13 and the free layer 15.

Table 2 sets forth a relationship between a lattice constant of a material used for the underlying layer, a type of strain exerted on the reference and free layers, and a type of the magnetic anisotropy. In detail, Table 2 sets forth a relationship between a material used for the underlying layer, its lattice constant (a [nm]), a difference in lattice constant with respect to $Co_2MnSi$ Heusler alloy (Lattice Misfit [%]), a type of strain, and a perpendicular magnetic anisotropy.

TABLE 2

| Underlying Material | Lattice Constant a[nm] | Misfit in lattice constant [%] | Strain | Anisotropy |
|---|---|---|---|---|
| Pd | 0.55 | −2.8 | Compressive | Out-of-Plane (Perpendicular) |
| Cr | 0.572 | 1.0 | Tensile | In-Plane |
| MgO | 0.595 | 5.0 | Tensile | In-Plane |

As set forth in Table 2, in the case in which an insulating material (e.g., Pd in Table 2) for the underlying layer (e.g., the buffer layer 22 or the first capping layer 26) is selected to have a lattice constant that is less than the lattice constants of materials for the reference layer 13 and the free layer 15, a compressive strain is exerted on the reference layer 13 and the free layer 15 to thereby allow the reference layer 13 and the free layer 15 to have an increased perpendicular magnetic anisotropy characteristic.

As an example, the materials (e.g., $CaF_2$, $CeO_2$, $PrO_2$, $SrTiO_3$, $Sm_2O_3$, $Gd_2O_3$, or Si) that are used for the barrier layer 14 in the first embodiment may be used for a material forming the underlying layer (e.g., the buffer layer 22 or the first capping layer 26).

In the MTJ device of the second embodiment, the underlying layer (e.g., a buffer or capping layer) may be formed from an insulating material having a lattice constant that is less than the lattice constants of the materials forming the reference and free layers, and this may make it possible to exert a compressive strain on the reference and free layers and, consequently, to increase perpendicular magnetic anisotropy of the reference and free layers.

Figure 5:
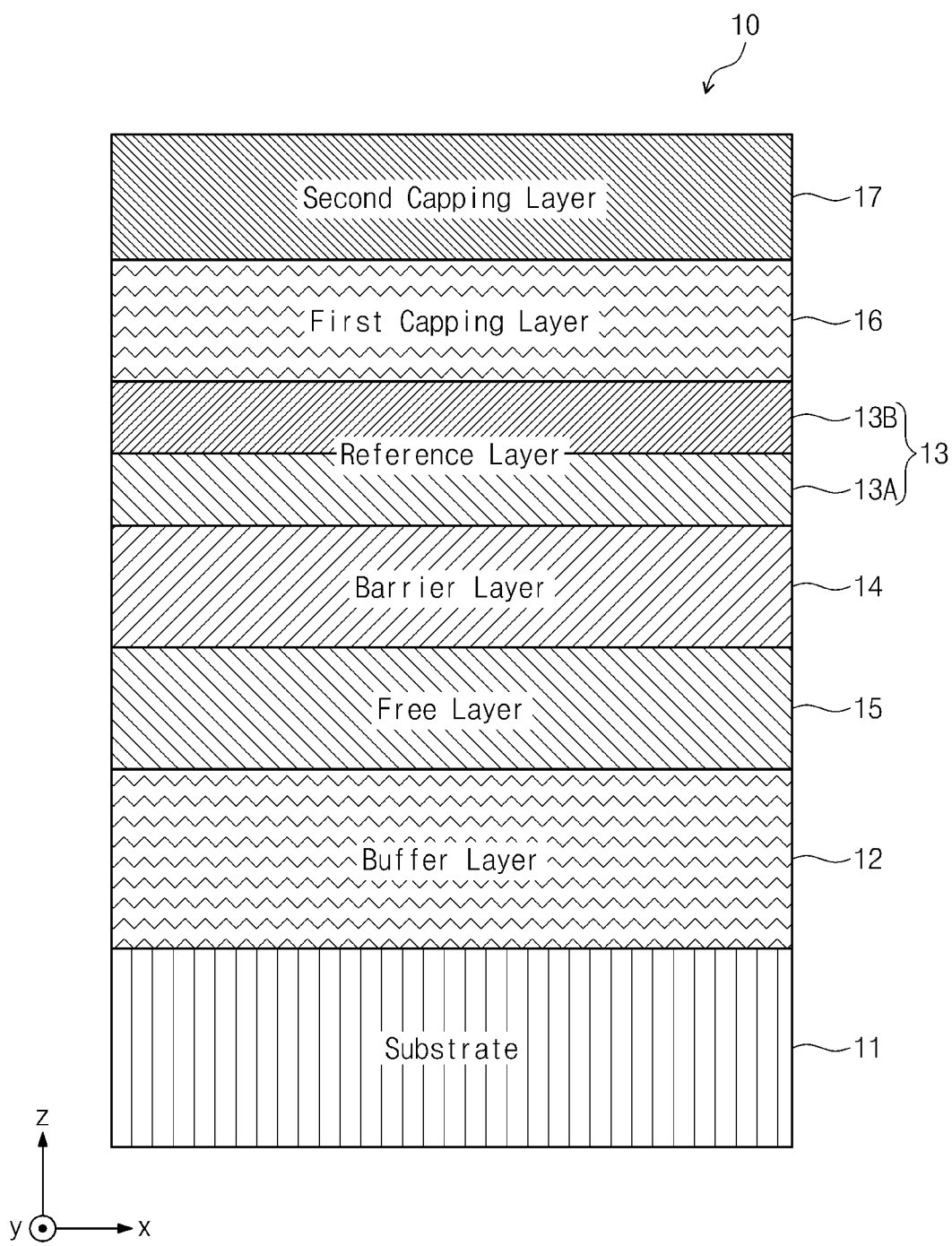
FIG. 5 depicts a sectional view of a magnetic tunnel junction device according to modification of the first embodiment of the inventive concept.

Furthermore, in the first and second embodiments, the buffer layer 12 or 22, the reference layer 13, the barrier layer 14, the free layer 15, and the first capping layer 16 or 26 may be stacked in the order listed, but the embodiments disclosed herein are not limited thereto. For example, in certain embodiments, the buffer layer 12 or 22, the free layer 15, the barrier layer 14, the reference layer 13, and the first capping layer 16 or 26 may be sequentially stacked, as depicted in FIG. 5.

Figure 6:
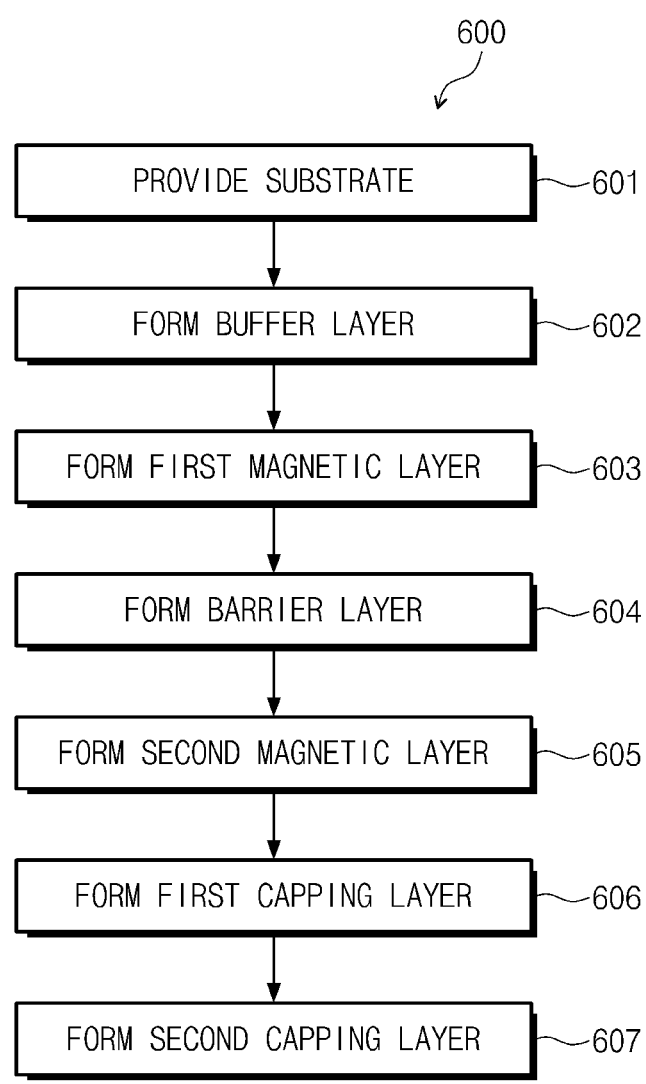
FIG. 6 depicts a flow diagram of an embodiment of a method of forming a magnetic tunnel junction device according to the subject matter disclosed herein.

FIG. 6 depicts a flow diagram 600 of an embodiment of a method of forming a magnetic tunnel junction device according to the subject matter disclosed herein. With reference to FIG. 1 and at 601 in FIG. 6, a substrate is provided that may be a silicon (Si) substrate having a thermally-grown oxide layer or a single-crystalline silicon (Si) substrate. At 602, a buffer layer is formed on the substrate using well-known techniques. The buffer layer may be used as a stabilization layer, and may be formed from at least one of Cr, Ta, Au, W, Pt, or Ti. In one embodiment, the buffer layer may comprise a lattice parameter that is smaller than the lattice parameters of the reference and/or free magnetic layers of the magnetic tunnel junction.

At 603, a first magnetic layer is formed on the buffer layer using well-known techniques. In one embodiment, the first magnetic layer is in direct contact with the buffer layer. In one embodiment, the first magnetic layer is a reference magnetic layer. In another embodiment, the first magnetic layer is a free magnetic layer. In one embodiment in which the first magnetic layer is a reference magnetic layer, the first magnetic layer includes a Heusler alloy layer and a Co/Pt multilayer. In some embodiments, the Heusler alloy layer may be formed from a Co-based full-Heusler alloy. The Co-based full-Heusler alloy may include, for example, $Co_2FeSi$, $Co_2MnSi$, $Co_2(Fe$—$Mn)Si$, $Co_2FeAl$, $Co_2CrAl$ or a combination thereof. In one embodiment in which the first magnetic layer is a free magnetic layer, the first magnetic layer may be formed from $Co_2FeSi$, $Co_2MnSi$, $Co_2(Fe$—$Mn)Si$, $Co_2FeAl$, $Co_2CrAl$. In one embodiment, the first magnetic layer has a first lattice parameter.

At 604, a barrier layer is formed on and in contact with the first magnetic layer using well-known techniques. In one embodiment, the barrier layer may be formed from an insulating material, such as $CaF_2$, $CeO_2$, $PrO_2$, $SrTiO_3$, $Sm_2O_3$, $Gd_2O_3$, or Si. In one embodiment, the barrier layer has a second lattice parameter that is less that, or smaller than, the first lattice parameter so that the lattice parameter of the barrier layer exerts a compressive strain on the lattice parameter of the first magnetic layer.

At 605, a second magnetic layer is formed on the barrier layer using well-known techniques. In one embodiment, the second magnetic layer is in direct contact with the barrier layer. In one embodiment, the second magnetic layer is a free magnetic layer. In another embodiment, the second magnetic layer is a reference magnetic layer. In one embodiment in which the second magnetic layer is a free magnetic layer, the second magnetic layer may include a Co-based full-Heusler alloy, such as, $Co_2FeSi$, $Co_2MnSi$, $Co_2(Fe-Mn)Si$, $Co_2FeAl$, $Co_2CrAl$ or a combination thereof. In one embodiment in which the second magnetic layer is a reference magnetic layer, the second magnetic layer includes a Heusler alloy layer and a Co/Pt multilayer. In some embodiments, the Heusler alloy layer may be formed from a Co-based full-Heusler alloy. The Co-based full-Heusler alloy may include, for example, $Co_2FeSi$, $Co_2MnSi$, $Co_2(Fe-Mn)Si$, $Co_2FeAl$, $Co_2CrAl$ or a combination thereof. In one embodiment, the lattice parameter of the second magnetic is greater than, or is larger than, the lattice parameter of the barrier layer so that the lattice parameter of the barrier layer exerts a compressive strain on the lattice parameter of the second magnetic layer.

At 606, a first capping layer is formed directly on the second magnetic layer using well-known techniques. The first capping layer may be used as a stabilization layer, and may include, for example, Ru and Ta. In one embodiment, the first capping layer has a lattice parameter that is less that, or smaller than, the lattice parameter of the second magnetic layer so that the lattice parameter of the first capping layer exerts a compressive strain on the lattice parameter of the second magnetic layer.

At 607, a second capping layer is formed on the first capping layer using well-known techniques. The second capping layer may be used as a stabilization layer, and may include, for example, Ru and Ta. In one embodiment, the second capping layer has a lattice parameter that is less that, or smaller than, the lattice parameter of the second magnetic layer so that the lattice parameter of the second capping layer exerts a compressive strain on the lattice parameter of the second magnetic layer.

Third Embodiment

A magnetoresistive memory device according to a third embodiment may include the MTJ device that has been described with reference to the first or second embodiments.

Figure 7:
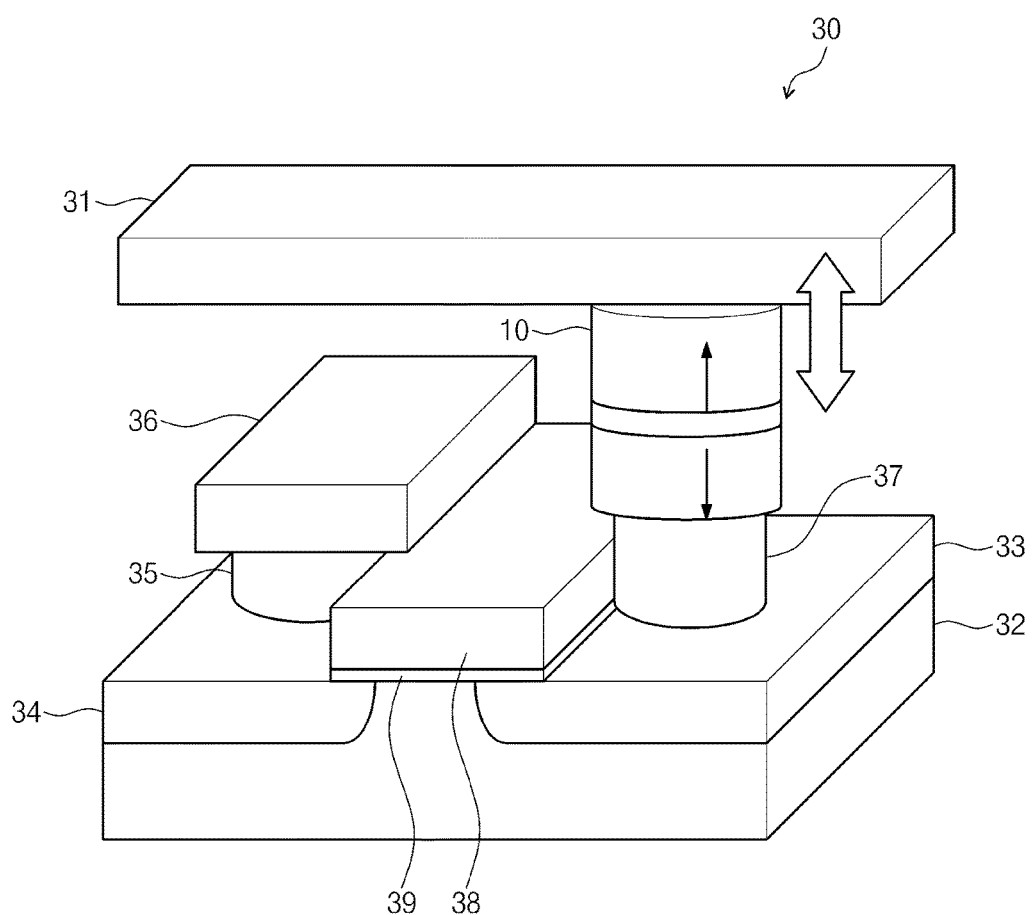
FIG. 7 depicts a perspective view exemplarily illustrating a portion of a magnetoresistive memory device, according to a third embodiment of the inventive concept.

FIG. 7 depicts a perspective view of a portion of a magnetoresistive memory device according to a third embodiment.

Referring to FIG. 7, a magnetoresistive memory device may include a memory cell 30, a bit line 31, contact plugs 35 and 37, and a word line 38.

The memory cell 30 may include a semiconductor substrate 32, diffusion regions 33 and 34, a source line 36, a gate insulating layer 39, and a magnetoresistive device 10. In some embodiments, the MTJ device 10 of the first embodiment may be used as the magnetoresistive device 10, but in certain embodiments the MTJ device 20 of the second embodiment may be used as the magnetoresistive device 10.

In the magnetoresistive memory device, a plurality of the memory cells 30 may be disposed in a matrix shape or an array, and a plurality of the bit lines 31 and a plurality of the word lines 38 may be provided to connect the memory cells 30 to each other. A data writing operation of the magnetoresistive memory device may be performed using a spin torque injection technique.

The diffusion regions 33 and 34 may be formed in a top portion of the semiconductor substrate 32 and may be spaced apart from each other by a predetermined distance. In some embodiments, the diffusion region 33 may serve as a drain region, and the diffusion region 34 may serve as a source region. The diffusion region 33 may be coupled to the MTJ device 10 through the contact plug 37.

The bit line 31 may be disposed over the semiconductor substrate 32 and may be connected to the magnetoresistive device 10. The bit line 31 may be connected to a write circuit (not shown) and a read circuit (not shown).

The diffusion region 34 may be connected to the source line 36 through the contact plug 35. The source line 36 may be connected to the write circuit and the read circuit.

The word line 38 may be provided on the semiconductor substrate 32 with the gate insulating layer 39 interposed therebetween and may be connected to the diffusion regions 33 and 34. The word line 38 and the gate insulating layer 39 may be used as a part of a selection transistor. For example, in a case in which the word line 38 is activated by a current supplied from a circuit (not shown), the selection transistor may be turned on.

In the magnetoresistive memory device, the bit line 31 and the diffusion region 33 may be used as electrodes for applying a voltage to the MTJ device 10, and a magnetization direction of a ferromagnetic layer may be switched through a spin transfer torque effect that results from the applying of the voltage. Data stored in the magnetoresistive memory device may be changed by changing the direction of a current passing through the MTJ device 10.

In the magnetoresistive memory device of the third embodiment, the barrier layer may be formed from an insulating material having a lattice constant that is less than the lattice constants of the materials forming the reference and free layers, and this may make it possible to allow the magnetoresistive memory device to have improved perpendicular magnetic anisotropy characteristics and an increased integration density.

According to some embodiments, by using a Heusler alloy, it is possible to realize a magnetic tunnel junction device having both a perpendicular magnetic anisotropy and a half-metallicity.

According to some embodiments, a barrier layer may be formed from an insulating material having a lattice constant is smaller or less than the lattice constants of materials forming for the reference and free layers, and thus, the barrier layer may exert a compressive strain on the reference layer and the free layer. This may make it possible to improve the perpendicular magnetic anisotropy characteristics of the reference and/or free layers.

According to some embodiments, a ratio in lattice constant between the barrier layer and the reference layer and the free layer may be controlled to allow the reference layer and the free layer to have half-metallicity.

In addition, according to some embodiments, a magnetic tunnel junction device having two Heusler alloy layers may include a single insulating barrier layer that is provided to allow the two Heusler alloy layers to have not only a perpendicular magnetic anisotropy characteristic, but also a half-metallicity characteristic.

According to some embodiments, a barrier layer of a magnetic tunnel junction device may be formed from an insulating material having a lattice constant that is smaller than the lattice constants of materials forming the reference and free layers, and this may make it possible to improve a perpendicular magnetic anisotropy characteristic of the magnetic tunnel junction device and, consequently, to increase an integration density of the magnetoresistive memory device.

Figure 8:
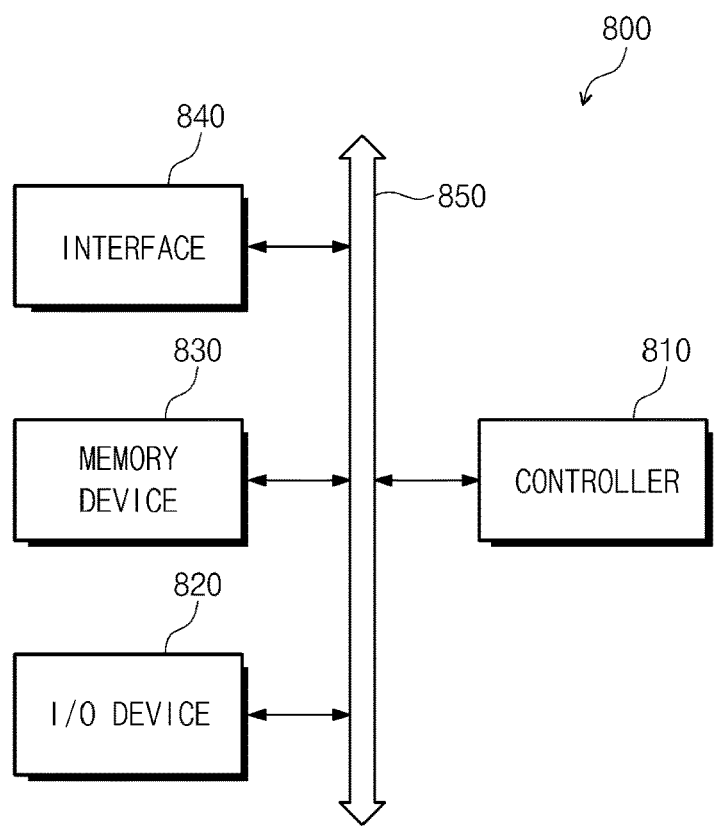
FIG. 8 depicts an electronic device that comprises one or more integrated circuits (chips) comprising a semiconductor device that includes a data storage device according to embodiments disclosed herein.

FIG. 8 depicts an electronic device 800 that comprises one or more integrated circuits (chips) comprising a semiconductor device that includes a magnetic tunnel junction device according to embodiments disclosed herein. Electronic device 800 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 800 may comprise a controller 810, an input/output device 820 such as, but not limited to, a keypad, a keyboard, a display, or a touch-screen display, a memory 830, and a wireless interface 840 that are coupled to each other through a bus 850. The controller 810 may comprise, for example, at least one microprocessor, at least one digital signal process, at least one microcontroller, or the like. The memory 830 may be configured to store a command code to be used by the controller 810 or a user data. Electronic device 800 and the various system components comprising a semiconductor device that includes a magnetic tunnel junction device according to embodiments disclosed herein. The electronic device 800 may use a wireless interface 840 configured to transmit data to or receive data from a wireless communication network using a RF signal. The wireless interface 840 may include, for example, an antenna, a wireless transceiver and so on. The electronic system 800 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 9:
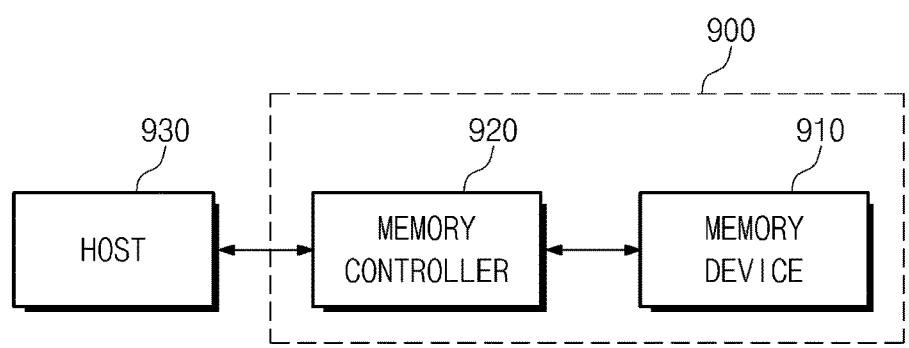
FIG. 9 depicts a memory system that may comprise one or more integrated circuits (chips) comprising a semiconductor device that includes a data storage device according to embodiments disclosed herein.

FIG. 9 depicts a memory system 900 that may comprise one or more integrated circuits (chips) comprising a semiconductor device that includes a magnetic tunnel junction device according to embodiments disclosed herein. The memory system 900 may comprise a memory device 910 for storing large amounts of data and a memory controller 920. The memory controller 920 controls the memory device 910 to read data stored in the memory device 910 or to write data into the memory device 910 in response to a read/write request of a host 930. The memory controller 920 may include an address-mapping table for mapping an address provided from the host 930 (e.g., a mobile device or a computer system) into a physical address of the memory device 910. The memory device 3210 may comprise one or more semiconductor devices that include a magnetic tunnel junction device according to embodiments disclosed herein.

While example embodiments have been particularly shown and described, it will be understood by one of ordinary skill in the art that variations in form and detail may be made therein without departing from the scope of the attached claims.

What is claimed is:
1. A magnetic tunnel junction device, comprising:
a free layer formed of a first Heusler alloy layer having a first surface and a second surface opposite to the first surface;
a barrier layer having a first surface and a second surface, the first surface of the barrier layer being in contact with the first surface of the first Heusler alloy layer;
a reference layer formed of a composite of a second Heusler alloy layer and a Co/Pt multilayer, wherein the second Heusler alloy layer is interposed between the barrier layer and the Co/Pt multilayer and wherein the second Heusler alloy layer is in contact with the second surface of the barrier layer;
a buffer layer disposed on the second surface of the first Heusler alloy layer,
wherein the first Heusler alloy layer is interposed between the barrier layer and the buffer layer,
wherein each of the barrier layer and the buffer layer has an insulating property so that a compressive strain is exerted on the first Heusler alloy layer in a direction parallel to an interface between the first Heusler alloy layer and the barrier layer.
2. The magnetic tunnel junction device of claim 1, wherein the first Heusler alloy layer is formed from a Co-based full-Heusler alloy having a $L2_1$ crystal structure.
3. The magnetic tunnel junction device of claim 2, wherein the first Heusler alloy layer contains $Co_2MnSi$.
4. The magnetic tunnel junction device of claim 3, wherein the interface between the first Heusler alloy layer and the barrier layer is parallel to an xy-plane, and when measured along an x-axis or a y-axis, a lattice constant of the barrier layer is within a range of 96% to 98%, compared with the lattice constant of the first Heusler alloy layer.
5. The magnetic tunnel junction device of claim 1, wherein the barrier layer contains at least one of $CaF_2$, $CeO_2$, $PrO_2$, $SrTiO_3$, $Sm_2O_3$, $Gd_2O_3$, and Si.
6. The magnetic tunnel junction device of claim 1, wherein the buffer layer is in contact with the second surface of the first Heusler alloy layer.
7. The magnetic tunnel junction device of claim 6, wherein the buffer layer contains at least one of $CaF_2$, $CeO_2$, $PrO_2$, $SrTiO_3$, $Sm_2O_3$, $Gd_2O_3$, and Si.
8. A magnetic tunnel junction device, comprising:
a first magnetic layer comprising a first Heusler alloy having a first lattice parameter;
a barrier layer comprising a first surface and a second surface, wherein the first surface of the barrier layer that is in contact with the first magnetic layer, the barrier layer comprising a dielectric material and having a second lattice parameter, the second lattice parameter being smaller than the first lattice parameter;
a second magnetic layer comprising a second Heusler alloy that is in contact with the second surface of the barrier layer and a Co/Pt multilayer that is in contact with the second Heusler alloy, wherein the second Heusler alloy is interposed between the barrier layer and the Co/Pt multilayer; and
a buffer layer disposed on the first surface of the barrier layer so that the first magnetic layer is interposed between the barrier layer and the buffer layer,
wherein the buffer layer contains at least one of $CaF_2$, $CeO_2$, $PrO_2$, $SrTiO_3$, $Sm_2O_3$, $Gd_2O_3$, and Si.
9. The magnetic tunnel junction device of claim 8, wherein the second lattice parameter of the barrier layer exerts a compressive strain on the first lattice parameter of the first magnetic layer.
10. The magnetic tunnel junction device of claim 8, wherein the second lattice parameter is 96% to 98% of the first lattice parameter along the first surface.

11. The magnetic tunnel junction device of claim 8,
wherein the first magnetic layer comprises $Co_2MnSi$, $Co_2FeSi$, $Co_2FeAl$, $Co_2CrAl$ or a combination thereof.

12. The magnetic tunnel junction device of claim 11, wherein the barrier layer comprises $CaF_2$, $CeO_2$, $PrO_2$, $SrTiO_3$, $Sm_2O_3$, $Gd_2O_3$, and Si.

13. The magnetic tunnel junction device of claim 8, wherein the second Heusler alloy has a third lattice parameter, the third lattice parameter being greater than the second lattice parameter.

14. The magnetic tunnel junction device of claim 13, wherein the second lattice parameter is 96% to 98% of the third lattice parameter along the first surface.

15. The magnetic tunnel junction device of claim 13, wherein the second lattice parameter of the barrier layer exerts a compressive strain on the first lattice parameter of the first magnetic layer and the third lattice parameter of the second magnetic layer.

16. A magnetoresistive device, comprising:
a first magnetic layer comprising a first Heusler alloy having a first lattice parameter;
a second magnetic layer comprising a second Heusler alloy having a second lattice parameter and a Co/Pt multilayer;
a barrier layer disposed between the first magnetic layer and the second magnetic layer and comprising a first surface and a second surface that is opposite from the first surface, the first surface being in contact with the first magnetic layer and the second surface being in contact with the second magnetic layer, the barrier layer comprising a dielectric material and having a third lattice parameter, the third lattice parameter being smaller than the first lattice parameter and the second lattice parameter; and
a buffer layer disposed on the first surface of the first magnetic layer opposite to the first surface so that the first magnetic layer is interposed between the barrier layer and the buffer layer,
wherein the buffer layer contains at least one of $CaF_2$, $CeO_2$, $PrO_2$, $SrTiO_3$, $Sm_2O_3$, $Gd_2O_3$, and Si.

17. The magnetoresistive device of claim 16, wherein the third lattice parameter of the barrier layer exerts a compressive strain on the first lattice parameter of the first magnetic layer and the second lattice parameter of the second magnetic layer.

18. The magnetoresistive device of claim 17, wherein the third lattice parameter of the barrier layer is 96% to 98% of the second lattice parameter of the second magnetic layer along the first surface.

19. The magnetoresistive device of claim 17, wherein the first Heusler alloy comprises $Co_2MnSi$, $Co_2FeSi$, $Co_2FeAl$, $Co_2CrAl$, or a combination thereof, and
wherein the second Heusler alloy comprises $Co_2MnSi$, $Co_2FeSi$, $Co_2FeAl$, $Co_2CrAl$, or a combination thereof.

* * * * *